United States Patent [19]

Goldstein

[11] Patent Number: 5,528,080
[45] Date of Patent: Jun. 18, 1996

[54] ELECTRICALLY CONDUCTIVE INTERCONNECTION THROUGH A BODY OF SEMICONDUCTOR MATERIAL

[76] Inventor: Edward F. Goldstein, 373 Western Dr., #H, Santa Cruz, Calif. 95060-3053

[21] Appl. No.: 355,026

[22] Filed: Dec. 13, 1994

Related U.S. Application Data

[62] Division of Ser. No. 27,222, Mar. 5, 1993, Pat. No. 5,447, 871.

[51] Int. Cl.$^6$ .................... H01L 21/324; H01L 21/477
[52] U.S. Cl. .................. 257/741; 257/621; 257/774; 257/775
[58] Field of Search ................... 257/741, 774, 257/771, 775, 777, 621

[56] References Cited

U.S. PATENT DOCUMENTS

| | | | |
|---|---|---|---|
| 2,770,761 | 11/1956 | Pfann | 317/235 |
| 3,895,967 | 7/1975 | Anthony et al. | 148/1.5 |
| 3,897,361 | 7/1975 | Saeki et al. | 252/316 |
| 3,904,442 | 9/1975 | Anthony et al. | 148/1.5 |
| 3,979,820 | 9/1976 | Anthony et al. | 257/49 |
| 4,074,342 | 2/1978 | Honn et al. | 361/411 |
| 4,239,312 | 12/1980 | Myer et al. | 339/17 N |
| 4,275,410 | 6/1981 | Grinberg et al. | 257/777 |
| 4,370,179 | 1/1983 | Roger | 148/175 |
| 4,535,424 | 8/1985 | Reid | 365/63 |
| 4,660,066 | 4/1987 | Reid | 257/777 |
| 4,720,308 | 1/1988 | Anthony et al. | 257/534 |
| 4,761,681 | 8/1988 | Reid | 257/777 |
| 4,773,972 | 9/1988 | Mikkor | 204/16 |
| 4,860,084 | 8/1989 | Shibata | 257/621 |

OTHER PUBLICATIONS

IEEE Transactions of Election Devices, vol. ED–25, No. 12, pp. 1945–1951, Dec. 1979, "Gate–Controlled Diodes for Ionic Concentration Measurement".

*Primary Examiner*—Rolf Hille
*Assistant Examiner*—Alexander Oscar Williams
*Attorney, Agent, or Firm*—Kam T. Tam

[57] ABSTRACT

Conductive feed-throughs formed by partially migrating conductive material in a body of semiconductor material are used to provide electrical interconnections between the semiconductor surfaces. In addition, the conductive feed-throughs furnish mechanical support and thermal dissipation paths for the body of semiconductor material.

9 Claims, 4 Drawing Sheets

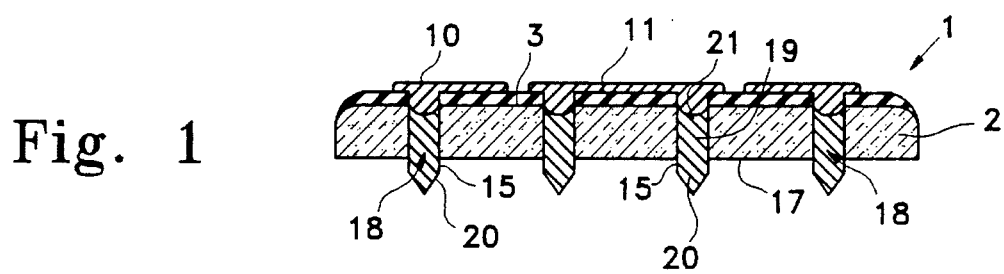
Fig. 1
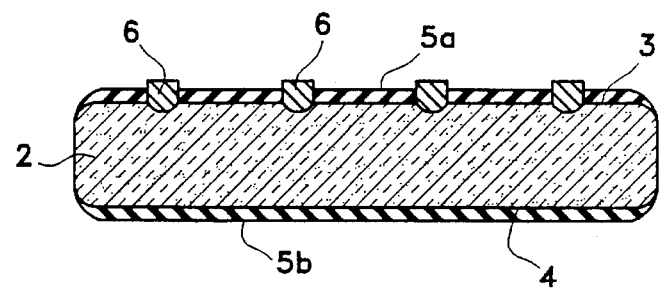
Fig. 2
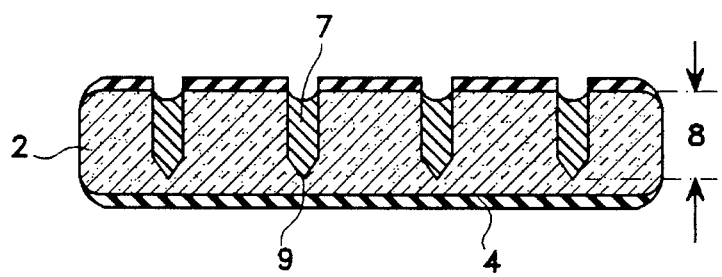
Fig. 3
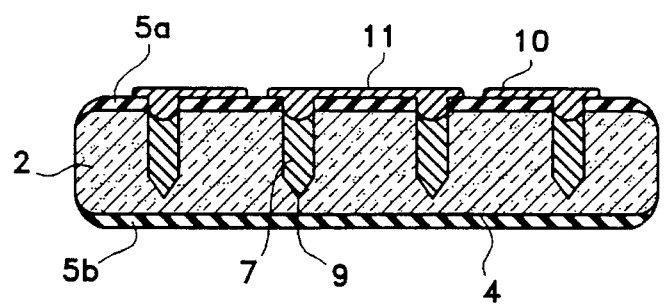
Fig. 4
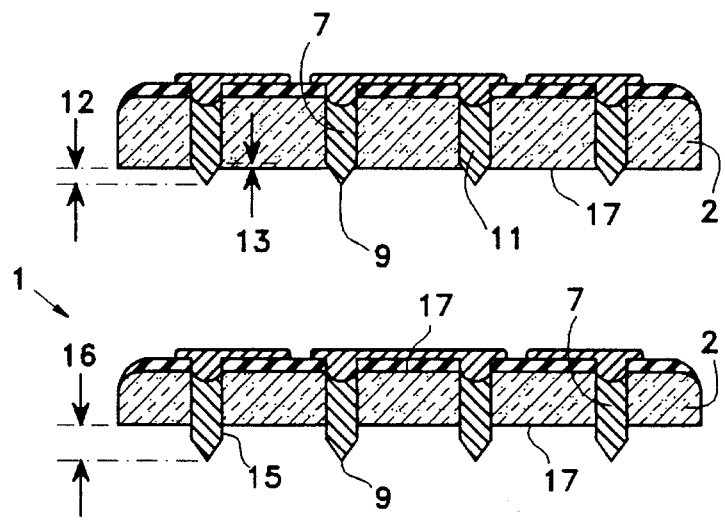
Fig. 5
Fig. 6

ELECTRICALLY CONDUCTIVE INTERCONNECTION THROUGH A BODY OF SEMICONDUCTOR MATERIAL

This is a divisional application of a application having Ser. No. 08/027,222, filing date, Mar. 5, 1993, now U.S. Pat. No. 5,447,871.

BACKGROUND OF THE INVENTION

1. Field of the Invention

The present invention relates generally to electrically conductive feed-throughs in semiconductor material, and more particularly, to structures and methods of forming electrically conductive interconnections through semiconductor material, thereby providing electrical connections between the semiconductor surfaces and concurrently providing mechanical support and thermal dissipation paths for the semiconductor material.

2. Description of the Related Art

Performance and reliability of electronic systems are directly related to how the electronic components are packaged and interconnected in the systems.

As a general rule, electronic systems are rated by their raw speed and their capacity of data processing. Modern day electronic systems typically comprise electronic devices such as transistors which have an inherent response time to electrical signals. Such response time, very often, is trivial in comparison with the delay time for an electrical signal to travel from one electronic device to another. Long electrical signal interconnection paths not only prolong propagational delays and increase susceptibility to noise, they also require more power dissipation and degrade the entire system performance in general. For these reasons, in an attempt to upgrade system performance by minimizing the aforementioned drawbacks, most integrated circuits are fabricated on a large-integrated scale. Equally as important, as a result of large-scale-integration, reliability is also improved since the number of off-chip interconnections are decreased. These off-chip interconnections are major sources of mechanical and electrical failures. Above all, cost is substantially curtailed as the required off-chip wiring schemes are simplified.

A typical electronic system may comprise a variety of electronic components. These components may be fabricated on various materials such as silicon, germanium, or gallium arsenide. Very often, it is impossible for these various components to be integrated on a single substrate due to performance consideration or cost concern. Consequently, these electronic components are packaged and electrically interconnected externally to function as a unity.

There are inventions in the past with electronic components stacked together, whereby electrical communication between components are made possible via feed-throughs in the semiconductor bodies. The assembled stacks are then attached onto a printed circuit board which has long routing traces and with all the associated shortfalls as mentioned. Moreover, the thermal coefficients of the assembled stacks and the printed circuit board are not always compatible, resulting in subsequent thermal mismatches and consequently reliability problems.

In general, the feed-throughs of most prior art structures are formed by first drilling holes into the semiconductor substrate. The side-walls of the holes are then insulated. Finally, conductive materials are deposited into the holes to transform the feed-throughs into electrically conductive paths. The holes can be drilled by a variety of methods. Examples include laser drilling, abrasive jet blasting, or chemical etching. The insulation on the sidewalls of the holes are commonly formed from the processes of oxidation or coating. The conductive filling inside the holes can be metal deposition by the processes of Chemical Vapor Deposition (CVD), or sputtering. Alternatively, the conductive filling can be an alloy such as lead-tin solder formed by submerging the holes in a molten solder bath.

Examples of the aforementioned structures with feed-throughs are taught in U.S. Pat. No. 4,074,342, entitled "Electrical Package for LSI Devices and Assembly Process Thereof" to Honn et al, Feb. 14, 1978; and U.S. Pat. No. 4,535,424, entitled "Solid State Three Dimensional Semiconductor Memory Array" to Reid, Aug. 13, 1985.

Other information of electrically conductive interconnections through a body of semiconductor material includes a publication by Anthony et al., in the Journal of Applied Physics, Vol. 52 No. 8 pages 5340–5349, August 1981, entitled "Forming Electrical Interconnections Through Semiconductor Wafers".

Alternatively, the feed-through can be formed by the process of thermomigration. Essentially, it is a process in which a thermal gradient is applied across the two opposite planer surfaces of a semiconductor substrate and in which the conductive material migrates from one surface to the other along the direction of the thermal gradient. Examples of the thermomigration process can be found in U.S. Pat. No. 4,239,312, entitled "Parallel interconnection for Planar Arrays" to Myer et al., Dec. 16, 1980; U.S. Pat. No. 4,275,410, entitled "Three-Dimensional Structured Microelectronic Device" to Grinberg et al., Jun. 23, 1981; U.S. Pat. No. 2,770,761, entitled "Semiconductor Translators Containing Enclosed Active Junctions" to Pfann, Nov. 13, 1956; U.S. Pat. No. 3,895,967, entitled "Semiconductor Device Production" to Anthony et al., Jul. 22, 1975; U.S. Pat. No. 3,899,361, entitled "Stabilized Droplet Method of Making Deep Diodes Having Uniform Electrical Properties" to Cline et al., Aug. 12, 1975; and U.S. Pat. No. 3,904,442, entitled "Method of Making Isolated Grids in Bodies of Semiconductor Material" to Anthony et al., Sep. 9, 1975. Further teachings on the thermomigration process can be found in technical papers such as the Journal of Applied Physics: Vol. 47, No. 6, pages 2316–2324, February 1976, entitled "Random Walk of Liquid Droplets Migrating in Silicon"; Vol. 47, No. 6, pages 2325–2331, February 1976, entitled "High-Speed Droplet Migrating in Silicon"; Vol. 47, No. 6, pages 2332–2336, February 1976, entitled "Thermomigration of Aluminum-Rich Liquid Wires Through Silicon"; Vol. 48, No. 9, pages 3943–3949, April 1977, entitled "Laminar Devices Processed by Thermomigration"; Vol. 49, No. 4, pages 2412–2419, November 1976, entitled "Migration on Fine Molten Wires in Thin Silicon Wafers"; Vol. 49, No. 5, pages 2777–2786, May 1978, entitled "On The Thermomigration of Liquid Wires"; and Vol. 49, No. 12, pages 5774–5782, December 1978, entitled "Stresses Generated by Thermomigration of Liquid Inclusions in Silicon". The aforementioned documents primarily focus on thermomigration as a means of fabrication P-N junctions and other electronic devices.

In the aforementioned U.S. Pat. Nos. 4,239,312 and 4,275,410, computer architectures of electrically interconnecting a plurality of stacked integrated circuit wafers by means of spring contacts are disclosed. These spring contacts are attached on both sides of a wafer after first thermomigrating electrical feed-throughs from one side of the wafer to the other side of the wafer. External electrical interconnections are made possible by pressing the springs of one circuit wafer to the bonding pads of an adjacent wafer.

It is an objective of the present invention to reduce the length of electrical interconnections between bodies of semiconductor material and thereby improving the performance of signal communication. Another objective of the present invention is to upgrade the reliability of electrical interconnections by reducing discontinuities in electronic signal paths between the bodies of semiconductor material. A further objective of the present invention is to provide improved thermal management between the bodies of semiconductor material. A still further objective of the present invention is to facilitate the dense use of electrical signal routing paths by means of existent semiconductor processing technology. A still further objective of the present invention is to reduce the number of fabrication steps and thereby curtails production cost.

SUMMARY OF THE INVENTION

The present invention meets the foregoing objectives by providing novel methods of fabricating semiconductor substrate having electrically conductive interconnections. Generally, the various embodiments of the invention comprise two fundamental steps, namely, thermomigrating an electrically conductive material into a body of semiconductor material at a predetermined depth, and selectively removing the semiconductor material from the semiconductor body. It here should be emphasized that the step of thermomigration involves only the partial migration of the conductive material into the semiconductor body, but not the complete migration through the semiconductor material as conventionally practiced.

Before the step of thermomigration, the semiconductor substrate is deposited on a first major planar surface with a conductive material. The semiconductor substrate with the electrically conductive material are then placed in a temperature gradient field. The conductive material begins to alloy with the semiconductor material in the direction of the temperature gradient. In the preferred method, the direction of the temperature gradient is substantially perpendicular to the two major planar surfaces. With the application of the temperature gradient through a predetermined duration, the conductive material leaves behind a solidified trail of highly conductive alloy material. When the desired depth of the conductive material into the body of semiconductor material is determined, the temperature gradient field is removed. The step of removing the unwanted semiconductor material then follows. Unwanted semiconductor material in the secondary major surface can be removed by various methods such as chemical etching, or other methods such that only the undesirable semiconductor material is removed and the themomigrated electrically conductive alloy material remains.

As a result of the application of the above mentioned methods, various embodiments can be fabricated. In the first embodiment, a body of semiconductor material fabricated with interconnecting columns of the conductive alloy spans from the first major planar surface to the second major planar surface, with portions of the column protruding out of the second major planar surface.

In the second embodiment, an interconnecting semiconductor substrate is formed by migrating electrically conductive material from the second major planar towards the first major planar surface. Unwanted semiconductor material and conductive material are then removed from the first major planar surface. The resultant structure comprises a leveled new first major planar surface having interconnecting column with smaller electrically conductive surfaces on a first major planar surface in comparison to the surfaces on the second major planar surface.

In the third embodiment of the invention, a semiconductor substrate is obtained by removing unwanted semiconductor materials on both first and second major surfaces, thereby exposing the columns of conductive material beyond both planar surfaces.

In the fourth embodiment, the semiconductor substrate is formed in the same manner as the first embodiment except unwanted semiconductor material in the second major planar surface is removed in a pattern of recesses around the columns of the conductive material. The conductive material extends beyond the second surface through the recesses.

With the aforementioned embodiments, electrical connections between the first and second major planar surfaces of the body of semiconductor material are made possible. Furthermore, the first, second or both major planar surfaces of the body of semiconductor material may be metallized with bonding pads or routing traces, thereby making external electrical communication possible.

It should be noted that the electrically conductive interconnections may be fabricated in a variety of shapes, such as dots, lines, rectangles, or combinations thereof.

DESCRIPTION OF THE DRAWINGS

FIG. 1 is a cross-sectional view of the first embodiment of the present invention;

FIGS. 2–6 are sequential views illustrating the process of fabrication at various stages of the embodiment shown in FIG. 1;

Embodiment One

DETAILED DESCRIPTION OF THE INVENTION

Figure 7:
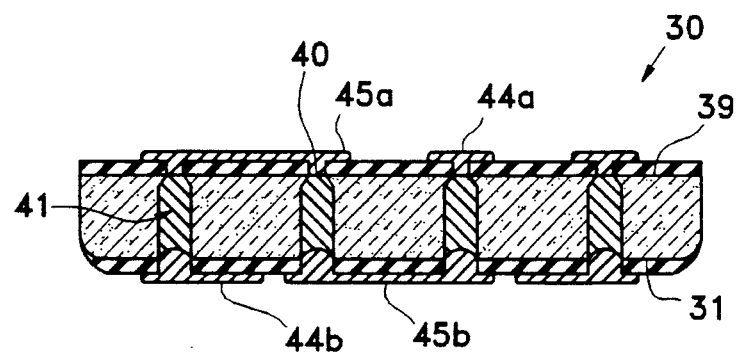
FIG. 7 is a cross-sectional view of the second embodiment of the present invention.

Reference is now made to FIG. 1 which shows the first embodiment of the present invention. The structure is generally denoted by reference numeral 1 which comprises a body of semiconductor material 2 having a first major planar surface 3 and a new second major planar surface 17. Disposed inside the structure 1 are conductive interconnections 18 stretching from the first major planar surface 3 to the second major surface 17. Each of the conductive interconnections 18 generally comprises a body portion 19, a first end portion 20 and a second end portion 21. There is a also a shank portion 15 disposed between the first end portion 20 and the body portion 19. As is shown in FIG. 1, conductive interconnections 18 extend beyond the second major planar surface 17, exposing the first end portion 20 and the shank portion 15. Atop the first major planar surface 3 are optional contact pads 10 and conductive traces 11.

FIGS. 2–6 are sequential drawings illustrating the fabrication process of structure 1. The process starts with growing insulating layers 5a and 5b of approximately 25 microns each atop the first planar surface 3 and another major planar surface, called the third major planar surface 4 in this case, respectively, by oxidating the body of semiconductor material 2 in an ambient temperature of approximately 1200 degrees Celsius for 12 hours. Photoresist is then spun on the top of the grown oxide 5a and then baked. A photolithographic mask with desired patterns is thereafter placed atop the photoresist, and the structure is illuminated with Ultra Violet (UV) light. This process is called image transfer and the exposed portions of the photoresists with the underlying oxide 5a are then etched away by the conventional etching methods. For example, if a dry etch method is employed, structure 1 can be placed inside a plasma chamber. If the method of wet etch is preferred, structure 1 can be placed in a bath filled with a chemical etchant such as Hydrofluoric Acid (HF) buffered with Ammonium Fluoride ($NH_4F$). Up to this juncture, etched away photoresist and patterned oxide 5a exposes bare silicon which can be oxidized and deposited with an undesirable thin film of native oxide very easily. The accumulated native oxide, which can be developed in a matter of minutes, negatively affects the subsequent migration process. Structure 1 must be therefore transferred quickly to the conductive material deposition chamber which is the next step of the fabrication process. In this embodiment, the conductive material used is aluminum. It should be noted that other conductive materials can also be used. Examples are gold, copper, lead, or tin, to name just a few. The deposition method can be the conventional CVD method which needs no further elaboration in here. What follows is the step of lift-off which essentially is the step of submerging structure 1 in a chemical bath filled with an etchant which attacks the photoresist but not the deposited aluminum. The resultant structure up to this step is shown in FIG. 2. The deposited conductive material is denoted by reference numeral 6. Alternatively, the area for the deposition of conductive material 6 can be undercut as recesses by the conventional dry or wet etching steps. The agent for dry etch of silicon in this example can be fluorocarbons while the wet etch etchant can be nitric acid ($HNO_3$). The advantage associated with recesses is that the migration path for the conductive material can be relatively shortened.

To prepare for a smooth and uniform migration of the conductive material 6 into the body of semiconductor material 2, a step of annealing under an ambient temperature of 550 degrees Celsius is conducted. The step of annealing is basically a pre-alloying of the boundaries of the conductive material 6 and the body of semiconductor material 2 before the application of the temperature gradient. As was mentioned earlier, the presence of a slight trace of silicon dioxide at the boundaries between the conductive material and the semiconductor material will negatively affect the migration process. The reason is because, as in this case, the conductive material is aluminum and the semiconductor is silicon. Aluminum inherently reacts with silicon dioxide to form a compound called Aluminum Oxide ($Al_2O_3$) which seriously retards the migration process, if the presence of the silicon dioxide is substantial. Even the presence of a minute trace of silicon dioxide is unfavorable for the migration of aluminum in silicon. In such an instance, aluminum essentially sidetracks along the silicon dioxide resulting in a random migration pattern called junction spiking.

For the migration process to be effective, a temperature gradient must be applied to structure 1. The temperature gradient basically is a volume of space between a cooling source and a heating source. The heating source can be generated by the method of convection, conduction, or radiation. In the preferred method, the heating source is a conduction source disposed in conjunction with the cooling source inside a vacuum chamber under a pressure of between $1\times10^{-3}$ to $1\times10^{-6}$ Torr. Moreover, in the preferred method, the temperature gradient is positioned within 10 degrees with respect to the perpendicular direction to the surfaces of the body of semiconductor material 2. The temperature of the hot surface 4 is illuminated by the heating source at approximately 1100 degrees Celsius while the temperature of the cool surface 3 is controlled at about 1090 degree Celsius. The crystal orientation for substrate 2 is substantially in the <100>direction.

It here should be noted that for the theromigration process to take place, a solute and a solvent must be present. In the preferred method, the solute is the predeposited aluminum 6 and the solvent is silicon in the body of semiconductor material 2. Essentially, the heating source allows molten aluminum to dissolve itself in localized regions of silicon to form an aluminum silicon alloy. The compositional content of the alloy along its migration path is ever changing, and is determined by the phase diagram of the two materials. Phrased differently, aluminum dissolves itself in the Al/Si boundaries leaving behind a void which is filled immediately by the molten aluminum-silicon alloy 7. The velocity of migration is a function of factors such as temperature gradient, crystal orientation, pressure, or materials used, and can be predetermined if all the factors are known in advance. However, the velocity of migration is not affected by other factors such as gravitational force. Once a predetermined depth of alloy into the body of semiconductor material 2 is reached, the heat source is removed. The resultant structure up to this step is shown in FIG. 3, in which the predetermined depth is illustrated as desired depth 8. As was previously mentioned, the body of semiconductor material 2 is of the <100>orientation. The Al/Si alloy penetrates into the body of semiconductor material 2 in the form of a parymidal molten zone having an apex 9 as shown in FIG. 3.

Bonding pads 10 and conductive traces 11 can be formed on the resultant structure 1 after the step of thermomigration. The deposition of bonding pads 10 and conductive traces 11 can be accomplished through the conventional methods such as sputtering or CVD which are well known in the art and requires no detailed description in here. The resultant structure up to this step is shown in FIG. 4.

For the migrated conductive alloy material 7 to be effective electrical interconnections, material in the third major surface 4 must be removed. The method of material removal is achieved via a combination of mechanical and chemical etching steps. To begin with, oxide layer 5b accumulated at the third major surface 4 is first eliminated by submerging the third major planar surface 4 into hot sulfuric acid. After rinsing and drying, structure 1 is mechanically polished at its third major planar surface 4, up to the distance where the apexes 9 are barely reachable.

What follows is the process of wet planar anisotropic chemical etching. Essentially, polished structure 1 is submerged into a hot chemical bath filled with an Orientation Dependent Etching (ODE) etchant. Examples of ODE etchants are potassium hydroxide, tetra-methyl-ammonium-hydroxide, or ethylene-diamine & pyrocatechal. The ODE etchant attacks only silicon and leaves the migrated alloy material 7 intact. The etching process can be timed until the parymidal apex 9 is partially exposed at a distance designated by reference 12 measured from third major planar surface 17 to the tip of apex 9, as shown in FIG. 5. Optionally, the etching process can be prolonged further until the shank portion 15 of migrated alloy material 7 is exposed, thereby exposing the tip of parymidal apex 9 at a distance 16 from third major planar surface 17. The resultant structure is shown in FIG. 6. In either cases, the area adjacent the parymidal apex 9 is rich in metal, in comparison to the material in the other areas of the migrated alloy material 7. The feature is ideal for subsequent metallization on third major planar surface 17, or for electrical contact with other structures. The electrical isolation between migrated alloy material 7 and the body of semiconductor material 2 can be accomplished by forming PN junctions therebetween via the application of proper biasing potentials.

It should be noted the mechanical polishing step can be skipped in the aforementioned process. Specifically, after the thermomigration step with a resultant structure as shown in FIG. 4, the wet planar anisotropic chemical etching can be applied directly. The extra step of mechanical polishing can therefore be eliminated, at the expense of a slower material removal rate.

Embodiment Two

FIG. 7 shows the structure of the second embodiment of the present invention generally denoted by reference numeral 30. Structure 30 is quite similar to structure 1 shown in FIG. 1 with a few modifications. To begin with, both first and the second major planar surfaces 31 and 39 are metallized with conductive bonding pads and traces. Furthermore, electrical conductive interconnections 41 comprises truncated planar contact areas 40 instead of apexes 9 as shown in FIG. 3.

Figure 8:
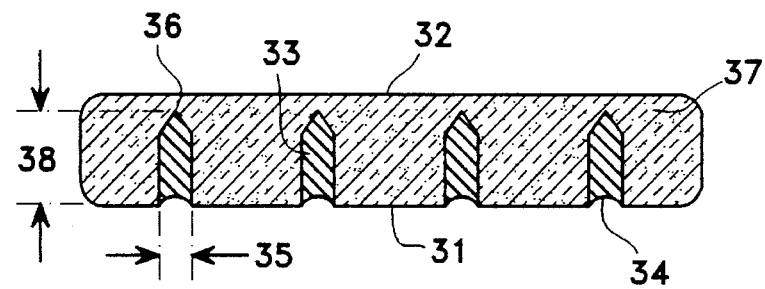
FIGS. 8–11 are sequential views illustrating the process of fabrication at various stages of the embodiment shown in FIG. 7.
Figure 9:
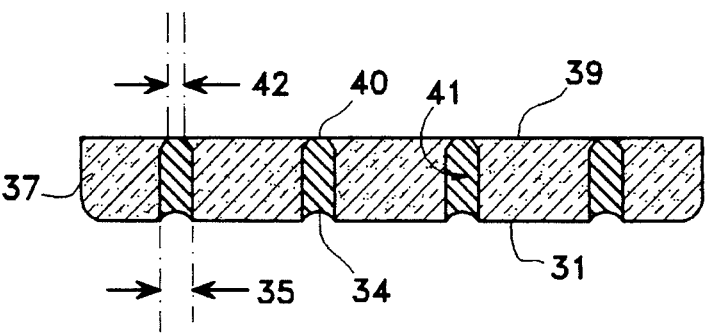
Figure 10:
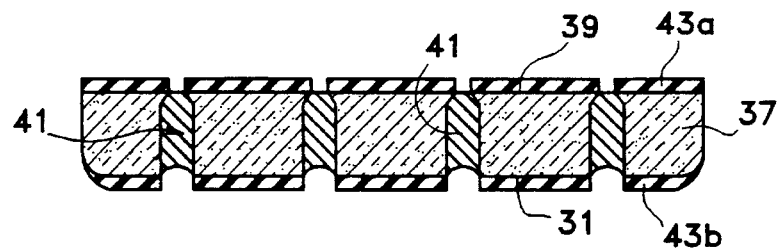
Figure 11:
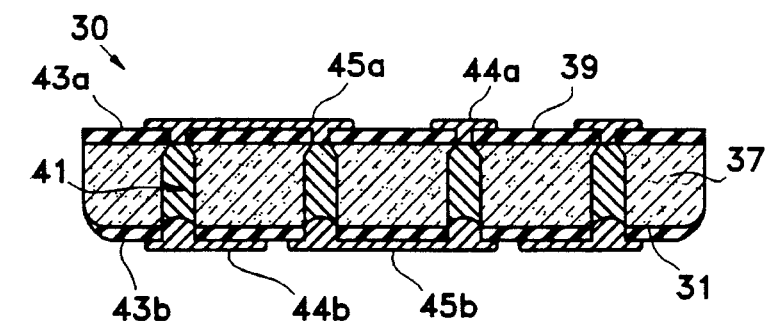

FIGS. 8–9 are sequential drawings illustrating the fabrication process for structure 30. There are a number of similarities between this method and the previous method. For the sake of a clear and concise illustration, only the differences are highlighted.

In this method, the migration of conductive material 33 is from the first major planar surface 31 to the third major planar surface 32. The process of thermomigration is substantially similar to the previous method and is therefore not elaborated further in here. It here should be noted that the usage of the terms, such as "first" and "second" in this specification and the appended claims to describe major planar surfaces, is for the convenience of illustration. The terms can well be exchanged without any loss of meaning as long as they are consistent in the context of the description. Attention is now directed back to FIG. 8. After the step of thermomigration, the resultant structure up to this step is shown in FIG. 8.

The step of material removal then follows. As with the previous method, both the mechanical polishing or chemical etching processes can be employed. Mechanical polishing can be applied from beginning to until the second major planar surface 39 and planar contact areas 40 of electrical interconnections 41 are exposed, as shown in FIG. 9. Alternatively, wet planar anisotropic chemical etching as mentioned earlier can be applied first, etching away the material in the body of semiconductor material 37, leaving the tip portions 36 of electrically conductive interconnections 41 exposed. The exposed tip portions 36 can then be mechanically polished away such that they are coplanar with the second major planar surface 39 as shown in FIG. 9. Also shown in FIG. 9 is that contact areas 40 with a cross-sectional dimension 42 is smaller than contact area 35 with a cross-sectional dimension 35. This is especially advantageous for dense metallization performed on the second major planar surface 39 later.

The step of metallization then follows for the forming of bonding pads 44a and conductive traces 45b on the second major planar surface 39, or bonding pads 44b and conductive traces 45b on first major planar surface 31. However, insulating layers 43a and 43b must be formed on the second and first major surfaces 39 and 31, respectively, before the metallization process. The steps of forming insulating layers and metallization are well known in the art and are not elaborated in here. As with the previous method, electrical isolations between electrically conductive interconnections 41 and semiconductor substrate 37 can be accomplished by forming PN junctions therebetween with the proper application of biasing potentials.

Embodiment Three

Figure 12:
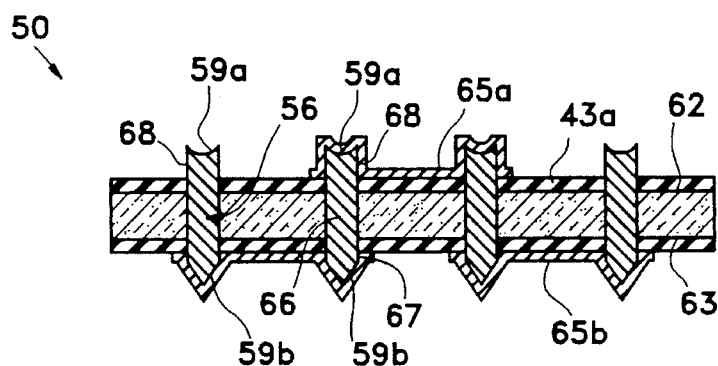
FIG. 12 is a cross-sectional view of the third embodiment of the present invention.

FIG. 12 shows the structure of a third embodiment of the present invention generally designated by reference numeral 50. The distinguishable feature of this embodiment is that conductive interconnections 56 comprise protruding first portions 59a and second portions 59b at both ends. Each conductive interconnection 56 generally comprises a body portion 66, a first shank portion 67, and a second shank portion 68. All the portions are integral with conductive interconnection 56 with the first and second shank portions 67 and 68 disposed adjacent to first and second end portions 59a and 59b, respectively. Conductive metal traces 65a and 65b are also formed on the major surfaces 62 and 63, respectively.

Figure 13:
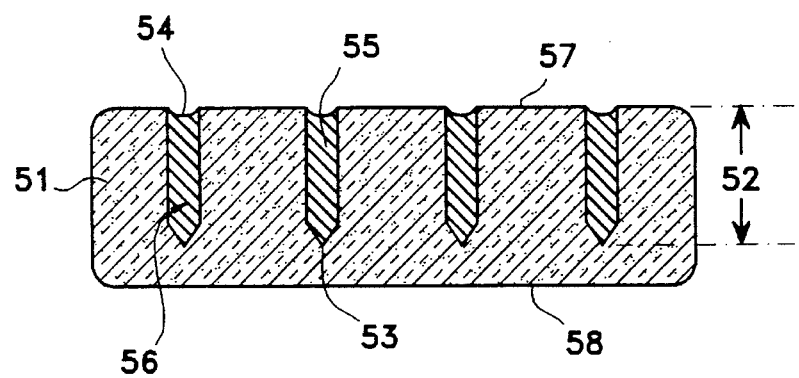
FIGS. 13–16 are sequential views illustrating the process of fabrication at various stages of the embodiment shown in FIG. 12.
Figure 14:
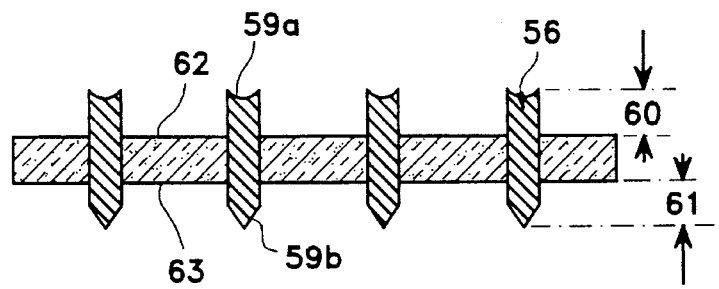
Figure 15:
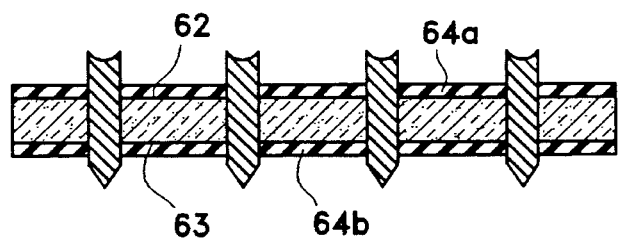
Figure 16:
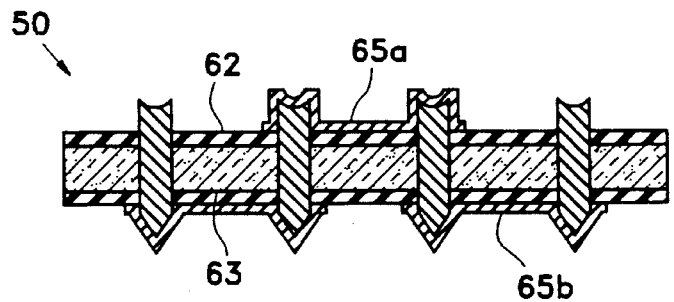

FIGS. 13–16 are sequential drawings illustrating the fabrication process of structure 50. Again, there are a number of similarities between this method and the previous methods and only the differences are discussed. After the step of thermomigration, the resultant structure is as shown in FIG. 13. As was previously mentioned, the body of semiconductor material 51 used is of <100>orientation, and the migration process is stopped after a predetermined depth 52 is reached. Moreover, there are pyramidal apexes 53 and partial voids 54 in each of the conductive interconnections 56. As is different from the previous methods, materials are removed from both major planar surfaces 57 and 58. The removal of materials on both first and second major planar surfaces 57 and 58 can be carried out simultaneously, forming new third and fourth major surfaces 62 and 63, respectively. However, materials can be removed on one major surface at a time as an alternative. Should this be the case, a protective mask must be applied on the other surface during the material removal process. The material used for the mask can be wax, silicon dioxide, or silicon nitride. In the preferred method, materials are removed simultaneously by use of the wet planar anisotropic chemical etching process as was discussed. After rinsing and drying, the resultant structure is shown in FIG. 14, in which conductive interconnections 56 are illustrated as protruding out of third and fourth major planar surfaces 62 and 63 with distance 60 and 61, respectively. Afterwards, passivation layers such as insulating layers 64a and 64b can be formed on third and fourth major surfaces 62 and 63, respectively, as shown in FIG. 15. The insulating layers 64aand 64b can be formed from the conventional deposition method, such as sputtering. Similarly, as shown in FIG. 16, conductive traces 65a and 65b can be formed on both surfaces 62 and 63, respectively, by the conventional method of deposition.

Embodiment Four

Figure 17:
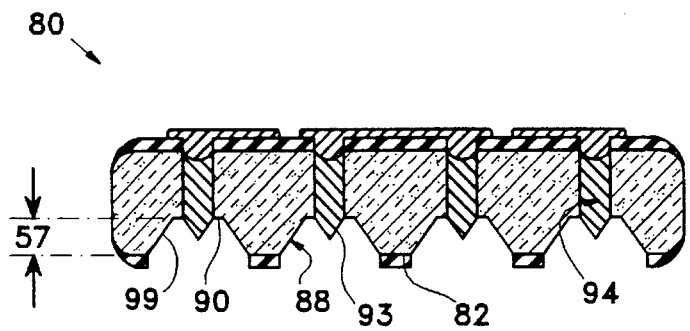
FIG. 17 is a cross-sectional view of the fourth embodiment of the present invention.

FIG. 17 shows a fourth embodiment of the present invention generally denoted by reference numeral 80. In this embodiment, recesses 88 are formed in second major surface 82. The pyramidal apexes 93 of conductive interconnections 94 are formed inside the recesses 88 but protrude out of the bottom portions therein.

Figure 18:
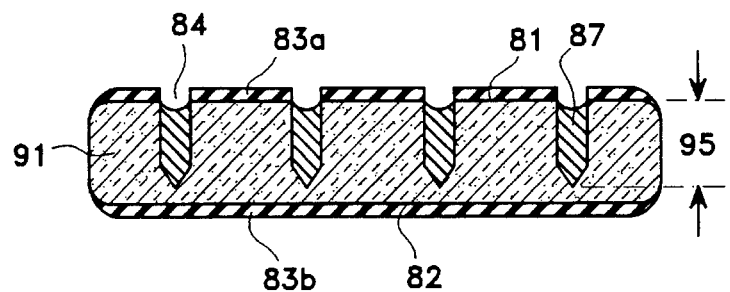
FIG. 18–20 are sequential views illustrating the process of fabrication at various stages of the embodiment shown in FIG. 17.
Figure 19:
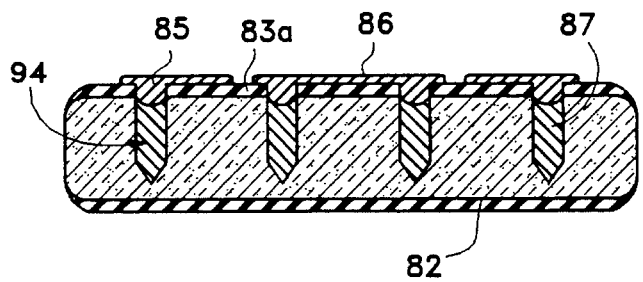
Figure 20:
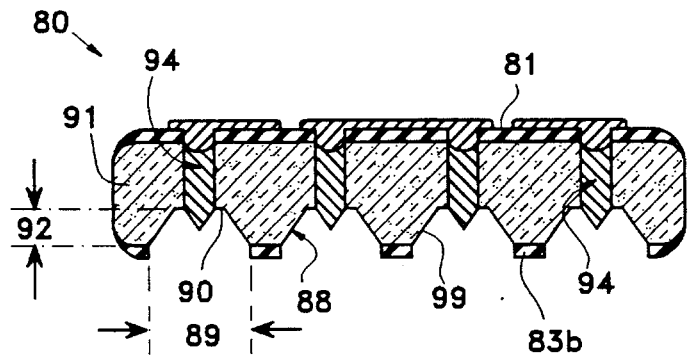

FIGS. 18–20 are sequential drawings illustrating the various stages of the fabrication process. Once again, with a number of similarities between this method and the previous methods, only the differences are elaborated. After the thermomigration process, with the thermomigrating alloy material 87 having a predetermined depth 95 inside the body of semiconductor material 91, insulating layers 83a and 83b are deposited on the first and second major planar surfaces 81 and 82, respectively. The deposition method can be the conventional sputtering method, for example. Thereafter, openings 84 can be formed on insulating layer 83a by the conventional masking and etching methods. The resultant structure up to this step is shown in FIG. 18.

The process of metallization follows which enables bonding pads 85 and conductive traces 86 to be deposited atop insulating layer 83a, and making electrical contacts with conductive interconnections 94. The resultant structure up to this step is shown in FIG. 19.

The formation of recesses 88 on second major planar surface 82 follows. To begin with, second major planar surface 82 of the structure shown in FIG. 19 is flipped over and is covered with photoresist, either by spraying or spinning. A photolithographic mask (not shown) with predefined patterns is then disposed atop the photoresist. The photoresist is then developed by UV light and hard baked. The image of the photolithographic mask is said to be transferred to the photoresist and the unwanted photoresist is then rinsed away. The step of etching follows. The etchant attacks the insulating material 83b but not the developed photoresist. The result is that windows in the dimensions shown as 89 in FIG. 20 are opened up in the insulating material 83b. Recesses 88 are available through another step of etching. The step of etching can either be dry of wet etching. The step of etching can also be conducted isotropically or anisotropically. In the preferred method, the anisotropically wet etching process is employed. First a masking layer is covered on the first major planar surface 81 for the shielding of the etchant. The masking layer can be silicon dioxide or wax. Then the entire structure 80 is submerged into a chemical bath filled with ODE etchant as was previously discussed. The ODE etchant attacks the silicon through the windows formed in insulating layer 83b with dimensions 89. As a consequence, recesses 88 are shaped pyramidally with sidewalls 99 along the <111>silicon crystal orientation and having flat bottom portions 90 as shown in FIG. 20. In contrast with many prior art structures, recessive 88 do not encroach deeply into the body of semiconductor body 61. Instead, depths 92 of recesses 88 are relatively shallow. As a result, window dimensions 89 can be maintained with smaller geometries. The consequential benefit is that a higher degree of integration for conductive interconnections 94 can be realized.

In should be noted that, in all the embodiments, the conductive interconnections fabricated are subjected to oxidation. For example, in the case of aluminum, a thin film of aluminum oxide is usually formed on the surface when exposed to the ambience even for a short period of time. Prior to field application, the oxide film is usually removed and coated with a barrier metal. One example is to coat the conductive interconnections with a lead-tin alloy. The coated conductive interconnections are thus wettable and attachable to the solder bumps of the Controlled Collapse Chip Connections (C4) via a solder reflow process, for example.

With the structures of the embodiments as described, a variety of applications can be realized. For example, active components, such as integrated chips or discrete transistors, or passive components, such as resistors, can be disposed to either, or both, of the major surfaces of the structures. In contrast, in most prior art multi-chip assemblies, integrated chips are disposed on a printed circuit board and electrically communicate with the printed circuit board through bonding wires. With the assembly of the present invention, lengths of electrical paths are substantially curtailed as there are no bonding wires involved. Moreover, conductive traces of the structure of the present invention can be defined with finer resolutions by the semiconductor processing technology, as compared to the wiring traces in a printed circuit board which is fabricated by methods such as stencil printing. As an additional benefit, with their short and comparatively large surface area, each conductive interconnection can serve as a good thermal path of the active integrated circuits. Such an advantage can not be materialized by the long and thin bonding wires.

Finally, other changes are possible within the scope of the present invention. For example, it is possible that the invention may be practiced in any combination of digital, analog, electro-optical, super-conducting, solid-state sensing, or micro-mechanical device technologies, to name but a few. Similarly, any process steps described might be interchangeable with other steps or methods in order to achieve the same result. While the present invention has been shown and described with reference to preferred embodiments thereof, it will be understood by those skilled in the art that these and other changes in form and detail may be made therein without departing from the scope and spirit of the invention as defined by the appended claims.

I claim:

1. An electrically conductive interconnection formed in a body of semiconductor material comprising:

a body of semiconductor material having a first and a second major planar surface; and an electrically conductive interconnection comprising an alloy of a conductive material and the material of the body of semiconductor material, said electrically conductive interconnection including a body portion, a first and a second end portion, said body portion being integrally formed between said first and second end portions, said conductive interconnection being formed by partially migrating said conductive material in said body of semiconductor material from said first planar surface toward a third planar surface, and having said third planar surface removed exposing said second planar surface and retaining said partially migrated conductive material including said first end portion which is substantially higher in alloy content with said electrically conductive material than the other portions.

2. The electrically conductive interconnection as set forth in claim 1 wherein said first end portion being pyramidal in shape with a truncated apex portion thereof having a cross-sectional area smaller than the cross-sectional area of said body portion, said cross-sectional area of said truncated apex portion being coplanar with said second major planar surface.

3. The electrically conductive interconnection as set forth in claim 1 wherein said first end portion being pyramidal in shape and having an apex portion thereof partially protruding beyond said second major planar surface of said body of semiconductor material.

4. The electrically conductive interconnection as set forth in claim 1 wherein said second major planar surface further comprising a recess having a sidewall portion and a bottom portion, and with said first end portion of said electrical interconnection protruding beyond said bottom portion of said recess.

5. The electrically conductive interconnection as set forth in claim 1 further comprising a first shank portion integrally formed between said body portion and said first end portion, and with said first shank portion and said first end portion protruding beyond said second major planar surface.

6. The electrically conductive interconnection formed in a body of semiconductor material as set forth in claim 1 wherein said conductive material comprises aluminum, and wherein said body of semiconductor material comprises silicon.

7. An electrically conductive interconnection formed in a body of semiconductor material comprising:

a body of semiconductor material having a first and a second major planar surface; and an electrically conductive interconnection comprising an alloy of a conductive material and the material of the body of semiconductor material, said electrically conductive interconnection including a body portion, a first and a second end portion, said body portion being integrally formed between said first and second end portions, said conductive interconnection being formed by partially migrating said conductive material in said body of semiconductor material from said first planar surface toward a third planar surface, and having said third planar surface removed exposing said second planar surface and retaining said partially migrated conductive material including said first end portion which is substantially higher in content with said electrically conductive material than the other portions, wherein said conductive material comprises copper and said body of semiconductor material comprises silicon.

8. An electrically conductive interconnection formed in a body of semiconductor material comprising:

a body of semiconductor material having a first and a second major planar surface; and an electrically conductive interconnection comprising an alloy of a conductive material and the material of the body of semiconductor material, said electrically conductive interconnection including a body portion, a first and a second end portion, said body portion being integrally formed between said first and second end portions, said conductive interconnection being formed by partially migrating said conductive material in said body of semiconductor material from said first planar surface toward a third planar surface, and having said third planar surface removed exposing said second planar surface and retaining said partially migrated conductive material including said first end portion which is substantially higher in content with said electrically conductive material than the other portions, wherein said conductive material comprises gold and said body of semiconductor material comprises silicon.

9. An electrically conductive interconnection formed in a body of semiconductor material comprising:

a body of semiconductor material having a first and a second major planar surface; and an electrically conductive interconnection comprising an alloy of a conductive material and the material of the body of semiconductor material, said electrically conductive interconnection including a body portion, a first and a second end portion, said body portion being integrally formed between said first and second end portions, said conductive interconnection being formed by partially migrating said conductive material in said body of semiconductor material from said first planar surface toward a third planar surface, and having said third planar surface removed exposing said second planar surface and retaining said partially migrated conductive material including said first end portion which is substantially higher in content with said electrically conductive material than the other portions;

wherein said conductive interconnection further including a first and second shank portions integrally formed between said body portion and said first and second end portions, respectively, and with said first and second shank portions protruding beyond said second and first major planar surfaces, respectively.

* * * * *